(12) United States Patent
Shepston

(10) Patent No.: US 6,281,687 B1
(45) Date of Patent: Aug. 28, 2001

(54) OFF-CHIP PROCESS, VOLTAGE, TEMPERATURE, COMPENSATION RESISTOR SHARING

(75) Inventor: Shad R. Shepston, Firestone, CO (US)

(73) Assignee: Agilent Technologies, Palo Alto, CA (US)

( * ) Notice: Subject to any disclaimer, the term of this patent is extended or adjusted under 35 U.S.C. 154(b) by 0 days.

(21) Appl. No.: 09/328,691

(22) Filed: Jun. 9, 1999

(51) Int. Cl.[7] .......................... G01R 31/26; G01R 35/00; G01R 27/04; G01V 3/10
(52) U.S. Cl. ........................................ 324/601; 324/719
(58) Field of Search .................... 324/719, 601, 324/638, 74; 327/341

(56) References Cited

U.S. PATENT DOCUMENTS

| | | | |
|---|---|---|---|
| 3,628,059 | * | 12/1971 | Niu .......................... 327/72 |
| 3,675,484 | * | 7/1972 | Pederson ................... 331/66 |
| 3,875,427 | * | 4/1975 | Riley ....................... 327/132 |
| 3,879,668 | * | 4/1975 | Edwards ................... 327/341 |
| 3,880,006 | * | 4/1975 | Poduje ..................... 374/173 |
| 3,940,752 | * | 2/1976 | Bair ......................... 340/870 |
| 3,986,109 | * | 10/1976 | Poduje ..................... 324/662 |
| 4,001,675 | * | 1/1977 | Veleber .................... 324/727 |
| 4,081,744 | * | 3/1978 | Ray ......................... 324/601 |
| 4,158,863 | * | 6/1979 | Naylor ..................... 361/56 |
| 4,331,913 | * | 5/1982 | Sparber .................... 323/303 |
| 4,623,799 | * | 11/1986 | Nyman, Jr. ............... 327/108 |
| 4,801,895 | * | 1/1989 | Melandri .................. 331/17 |
| 4,843,306 | * | 6/1989 | Meuller .................... 324/74 |
| 4,922,130 | * | 5/1990 | Swerlein ................... 327/94 |
| 4,935,645 | * | 6/1990 | Lee .......................... 327/86 |
| 4,951,236 | * | 8/1990 | Kawate et al. ........... 702/98 |
| 4,982,164 | * | 1/1991 | Schiek et al. ............ 324/638 |
| 5,088,325 | * | 2/1992 | Eichberger et al. ...... 73/304 C |
| 5,245,873 | * | 9/1993 | Fathauer et al. .......... 73/304 C |
| 5,402,082 | * | 3/1995 | Eccleston et al. ........ 327/530 |
| 5,442,296 | * | 8/1995 | Schiek et al. ............ 324/601 |
| 5,481,199 | * | 1/1996 | Anderson et al. ........ 324/705 |
| 5,532,983 | * | 7/1996 | Madrid et al. ............ 360/133 |
| 5,548,288 | * | 8/1996 | Lueng ...................... 341/136 |
| 5,621,310 | * | 4/1997 | Cosgrove et al. ........ 324/74 |
| 5,717,321 | * | 2/1998 | Kerth et al. .............. 323/283 |
| 5,886,529 | * | 3/1999 | Wakamatsu .............. 324/601 |
| 6,046,632 | * | 9/1998 | Straw ....................... 330/2 |

* cited by examiner

Primary Examiner—Glenn W. Brown
Assistant Examiner—Wasseem H. Hamdan
(74) Attorney, Agent, or Firm—Alexander J. Neudeck

(57) ABSTRACT

A process, voltage, and temperature calibration system that shares a single calibration resistor among multiple calibration circuits. The use of single calibration resistor among several calibration circuits is accomplished through time division multiplexing. N-channel and P-channel field effect transistor calibration also share the same resistor. Turning on transistors in calibration circuits of the type not being calibrated creates a low impedance path from one terminal of the calibration resistor to a power supply. This biases the calibration resistor for the calibration circuit.

17 Claims, 4 Drawing Sheets

US 6,281,687 B1

OFF-CHIP PROCESS, VOLTAGE, TEMPERATURE, COMPENSATION RESISTOR SHARING

FIELD OF THE INVENTION

This invention relates generally to digital output drivers for CMOS integrated circuits. More particularly, it relates to a circuit for calibrating the drive impedances of a group of CMOS output drivers.

BACKGROUND OF THE INVENTION

Dynamically calibrating the impedance of an output driver on an integrated circuit can have several advantages. It can reduce reflections on the output signal, reduce electromagnetic interference (EMI), reduce power dissipation, and reduce signal skew.

On a CMOS integrated circuit (IC), one way of controlling the impedance of an output driver is to split the pull-up transistor (typically a p-channel MOSFET (PFET) with it's source connected to the positive supply, VDD) and the pull-down transistor (typically a n-channel MOSFET (NFET) with it's source connected to the negative supply, GND) into multiple transistors. When the output driver is driving, each of these multiple transistors is then appropriately controlled to turn on, or remain off, according to a set of calibration signals such that the desired output impedance is achieved. Since the pull-up and pull-down transistors typically have different conductance and are sized differently, they usually require different sets of calibration signals. Normally, to generate these two set of calibration signals, two external resistors are used (one for the pull-up FETs and one for the pull-down FETs). This uses two calibration pins for each section of the chip that requires a different drive impedance. Since prudence would suggest having differently calibrated drivers for each side of the chip to compensate for process, voltage, and temperature fluctuations across a die as well as a different impedance for each type of signal, or group of signals, a large number of pins may have to be used as calibration pins. This increases the cost of the chip, and the assembly cost of any board the chip is used on.

Accordingly there is a need in the art for a way to reduce the number of pins and external resistors required for an impedance controlled CMOS output driver.

SUMMARY OF THE INVENTION

A preferred embodiment of the invention provides multiple sets of calibration signals but only uses two calibration pins and one external resistor. The invention may be implemented using standard CMOS circuits and may be used with existing controlled impedance output driver circuits.

An embodiment of the invention multiplexes the use of a single external calibration resistor between the calibration circuitry for multiple signal groups as well as the pull-up and pull-down calibration circuitry within signals groups. The calibration circuitry for a particular group and transistor type is assigned a time slice that it can use the calibration resistor. This ensures that only one of the calibration circuits is updating at a time. The other calibration circuits are controlled to hold their value. The drive transistors of the calibration circuits may be controlled to be either all on, or all off, depending on whether they match the type of transistor being calibrated.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENTS

Figure 1:
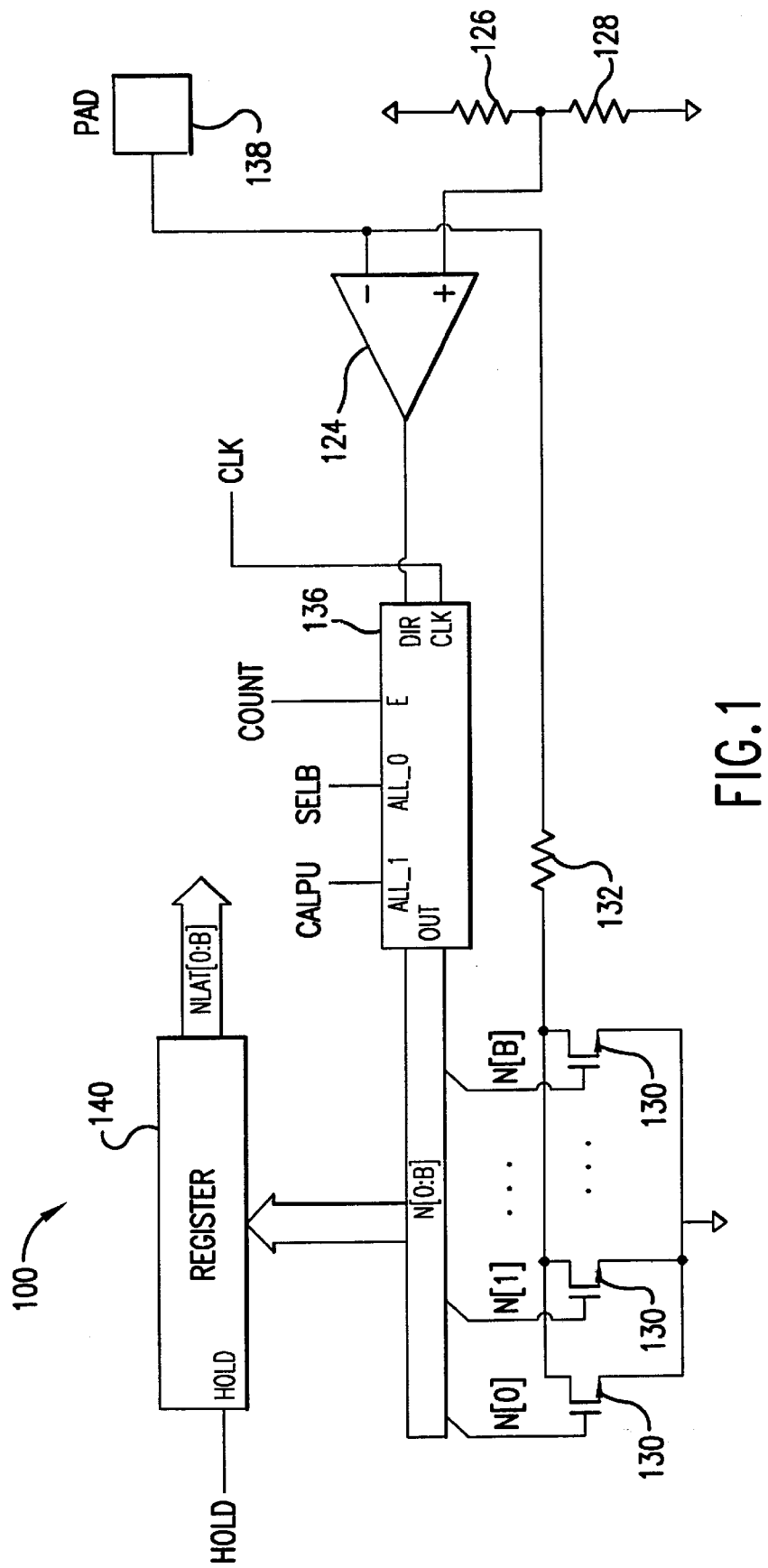
FIG. 1 is a schematic illustration of calibration circuitry for generating calibration signals for NFET drive transistors.

FIG. 1 is a schematic illustration of calibration circuitry for generating calibration signals for NFET drive transistors. This circuit is indicated generally as element 100. Each transistor of NFET array 130 is nominally equivalent in size to each transistor in the pull-down NFET array on a digitally controlled impedance output driver. Current flows from pad 138 through electrostatic discharge (ESD) protection resistor 132, through NFET array 130 to ground. Normally, pad 138 is connected to the first terminal of an external calibration resistor. The second terminal of the external calibration resistor is connected via a low impedance path to a positive supply voltage, VDD.

The impedances of the NFET array 130 and the ESD protection resistor 132 form a voltage divider with the external calibration resistor to divide down the positive supply voltage at the pad 138 node. This node is an input to the inverting terminal of analog comparator 124. The non-inverting input of analog comparator 124 is connected to a voltage divider formed with resistors 126 and 128. In the preferred embodiment, resistors 126 and 128 are on-chip resistors and are connected in series between the positive supply and the negative supply with the intermediate node connected to the non-inverting input of analog comparator 124. Resistors 126 and 128 can be fabricated using diode connected FETs, polysilicon, or some other type of substrate structure widely known in the art. In a preferred embodiment, resistors 126 and 128 have the same value so that the voltage at the non-inverting input of analog comparator 124 is VDD/2. The output of analog comparator 124 is connected to the DIR input of digital up/down counter 136 which controls the direction that up/down counter 136 counts. Up/down counter 136 is a saturating counter so that it does not roll over from it's highest output to the lowest and visa-versa. Up/down counter 136 increments or decrements the binary value on its outputs according to the state of DIR when the clock input, CLK, strobes and enable input, E, is set to enable counting. Enable input E is connected to signal COUNT. COUNT is controlled to enable up/down counter 136 to count by control circuitry that multiplexes the use of the external calibration circuitry. To avoid having multiple calibration circuits using the external calibration resistor at the same time, the control circuitry enables counting for a particular calibration circuit only when no other calibration circuits are using the external calibration resistor.

The outputs of up/down counter 136 are connected to signals N[0:B], each of which is connected to the gate of one of the transistors of NFET array 130. B is an arbitrary number setting the resolution of the calibration circuit where B+1 is the number of transistors in NFET array 136. In a preferred embodiment, the sizes of each transistor in PFET array 136 are scaled to correspond to the significance of the bit of N[0:B] connected to it's gate. For example, if N[i] controls a FET with conductance G, then N[i+1] controls a FET with conductance 2*G. In other embodiments the transistors could each have the same conductance or some other weighting scheme.

Up/down counter 136 counts up when the inverting input of comparator 124 is higher than the non-inverting input of analog comparator 124 and counting is enabled. This turns on more of the transistors of NFET array 130 decreasing the aggregate impedance of NFET array 130. When the inverting input of analog comparator 124 is lower than the non-inverting input of analog comparator 124 and counting is enabled, up/down counter 136 counts down turning off more of the transistors of NFET array 1increasing the impedance of NFET array 130. This feedback system stabilizes when the impedance of NFET array 130 and ESD protection resistor 132 nearly matches the resistance of the external calibration resistor.

Up/down counter 136 has two additional inputs that affect the state of the output signals, N[0:B]. Inputs ALL__1 and ALL__0 force all of the output signals N[0:B] to all logical 1's or all logical 0's, respectively. The ALL__0 input allows control circuitry to turn off all the transistors in NFET array 130 so that little or no current flows in pad 138. The ALL__1 input allows control circuitry to turn on all the transistors in NFET array 130 so that there is a relatively low impedance path from pad 138 to ground. The ALL__1 input of up/down counter 136 is connected to signal CALPU. The ALL__0 input of up/down counter 136 is connected to signal SELB. CALPU is intended to be asserted when the control circuitry is performing calibration on a pull-up array. SELB is intended to be asserted when the control circuitry is performing calibration on a pull-down array, but not the pull-down arrays of the instances of the calibration circuitry whose SELB signals are being asserted. The SELB signal and the COUNT signal allow the control circuitry to select which pull-down calibration circuitry is actively calibrating at any given time.

Register 140 is controlled by control circuitry via the HOLD input to latch the values of signals N[0:B]. The outputs of register 140 are connected to signals NLAT[0:B]. The signals NLAT[0:B] can be distributed to the output drivers to control their pull-down impedance. By latching N[0:B] with register 140, the operation of output drivers can continue when all of the output signals N[0:B] are forced to all logical 1's or all logical 0's, by ALL__1 or ALL__0, respectively.

Figure 2:
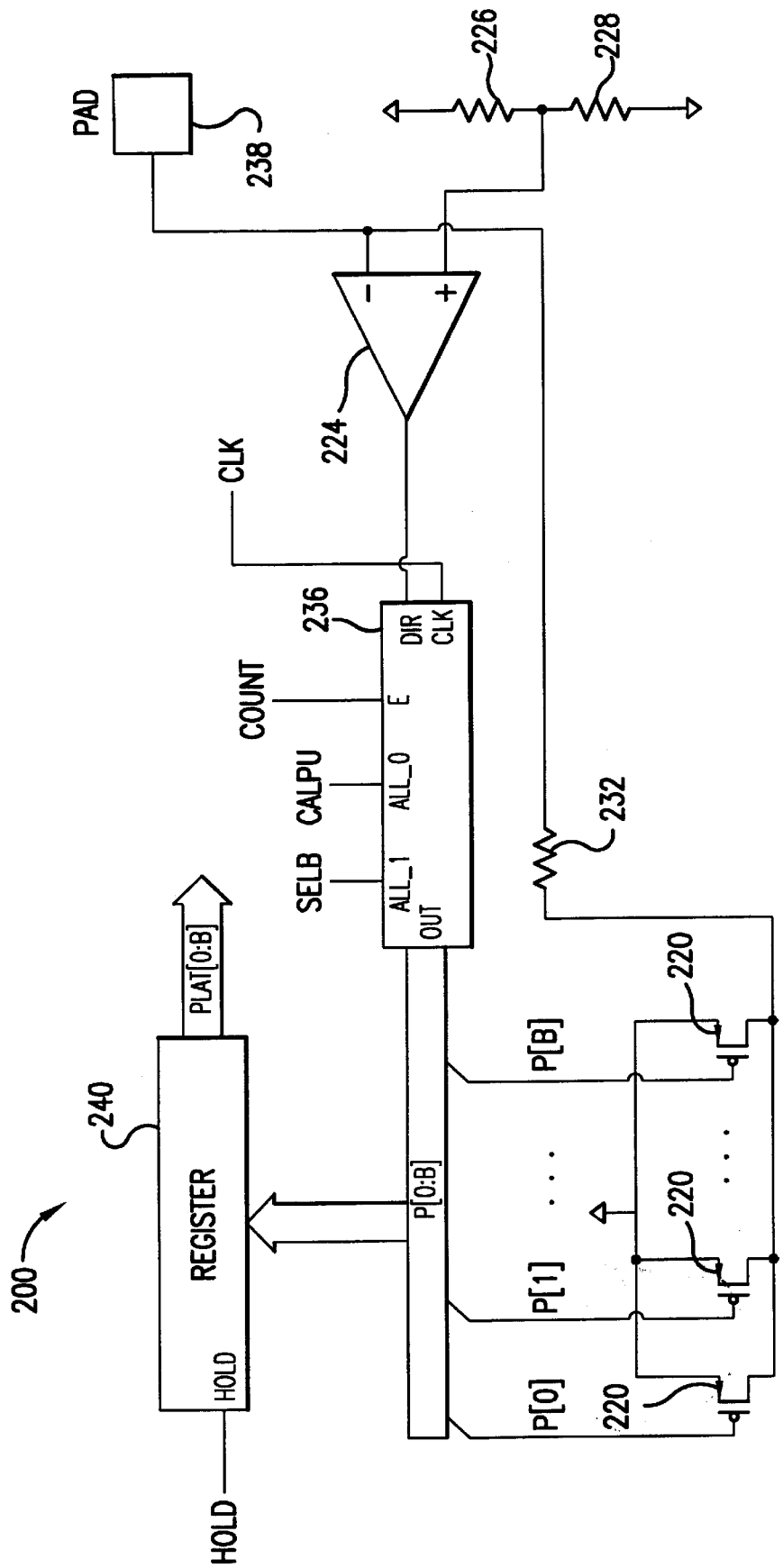
FIG. 2 is a schematic illustration of calibration circuitry for generating calibration signals for PFET drive transistors.

FIG. 2 is a schematic illustration of calibration circuitry for generating calibration signals for PFET drive transistors. This circuit is indicated generally as element 200. Each transistor of PFET array 230 is nominally equivalent in size to each transistor in the pull-up PFET array on a digitally controlled impedance output driver. Current flows from pad 238 through electrostatic discharge (ESD) protection resistor 232, through PFET array 230 to ground. Normally, pad 238 is connected to the first terminal of an external calibration resistor. The second terminal of the external calibration resistor is connected via a low impedance path to a negative supply voltage, GND or ground.

The impedances of the PFET array 230 and the ESD protection resistor 232 form a voltage divider with the external calibration resistor to divide down the positive supply voltage at the pad 238 node. This node is an input to the inverting terminal of analog comparator 224. The non-inverting input of analog comparator 224 is connected to a voltage divider formed with resistors 226 and 228. In the preferred embodiment, resistors 226 and 228 are on-chip resistors and are connected in series between the positive supply and the negative supply with the intermediate node connected to the non-inverting input of analog comparator 224. Resistors 226 and 228 can be fabricated using diode connected FETs, polysilicon, or some other type of substrate structure widely known in the art. In a preferred embodiment, resistors 226 and 228 have the same value so that the voltage at the non-inverting input of analog comparator 224 is VDD/2. The output of analog comparator 224 is connected to the DIR input of digital up/down counter 136 which controls the direction that up/down counter 236 counts. Up/down counter 236 is a saturating counter so that it does not roll over from it's highest output to the lowest and visa-versa. Up/down counter 236 increments or decrements the binary value on its outputs according to the state of DIR when the clock input, CLK, strobes and enable input, E, is set to enable counting. Enable input E is connected to signal COUNT. COUNT is controlled to enable up/down counter 236 to count by control circuitry that multiplexes the use of the external calibration circuitry. To avoid having multiple calibration circuits using the external calibration resistor at the same time, the control circuitry enables counting for a particular calibration circuit only when no other calibration circuits are using the external calibration resistor.

The outputs of up/down counter 236 are connected to signals P[0:B], each of which is connected to the gate of one of the transistors of NPFET array 230. B is an arbitrary number setting the resolution of the calibration circuit where B+1 is the number of transistors in PFET array 236. In a preferred embodiment, the sizes of each transistor in PFET array 236 are scaled to correspond to the significance of the bit of P[0:B] connected to it's gate. For example, if P[i] controls a FET with conductance G. then P[i+1] controls a FET with conductance 2*G. In other embodiments the transistors could each have the same conductance or some other weighting scheme.

Up/down counter 236 counts down when the inverting input of comparator 124 is higher than the non-inverting input of analog comparator 224 and counting is enabled. This turns on more of the transistors of PFET array 230 decreasing the aggregate impedance of PFET array 230. When the inverting input of analog comparator 224 is lower than the non-inverting input of analog comparator 224 and counting is enabled, up/down counter 236 counts up turning off more of the transistors of PFET array 230 increasing the impedance of PFET array 230. This feedback system stabilizes when the impedance of PFET array 230 and ESD protection resistor 232 nearly matches the resistance of the external calibration resistor.

Up/down counter 236 has two additional inputs that affect the state of the output signals, P[0:B]. Inputs ALL__1 and ALL__0 force all of the output signals P[0:B] to all logical 1's or all logical 0's, respectively. The ALL__1 input allows control circuitry to turn off all the transistors in PFET array 230 so that little or no current flows in pad 238. The ALL__0 input allows control circuitry to turn on all the transistors in PFET array 230 so that there is a relatively low impedance path from pad 238 to ground. The ALL__0 input of up/down counter 236 is connected to signal CALPD. The ALL__1 input of up/down counter 236 is connected to signal SELB. CALPD is intended to be asserted when the control circuitry is performing calibration on a pull-down array. SELB is intended to be asserted when the control circuitry is performing calibration on a pull-up array, but not the pull-up arrays of the instances of the calibration circuitry whose SELB signals are being asserted. The SELB signal and the COUNT signal allow the control circuitry to select which pull-up calibration circuitry is actively calibrating at any given time.

Register 240 is controlled by control circuitry via the HOLD input to latch the values of signals P[0:B]. The outputs of register 240 are connected to signals PLAT[0:B]. The signals PLAT[0:B] can be distributed to the output drivers to control their pull-down impedance. By latching P[0:B] with register 240, the operation of output drivers can continue when all of the output signals P[0:B] are forced to all logical 1's or all logical 0's, by ALL_1 or ALL_0, respectively.

Figure 3:
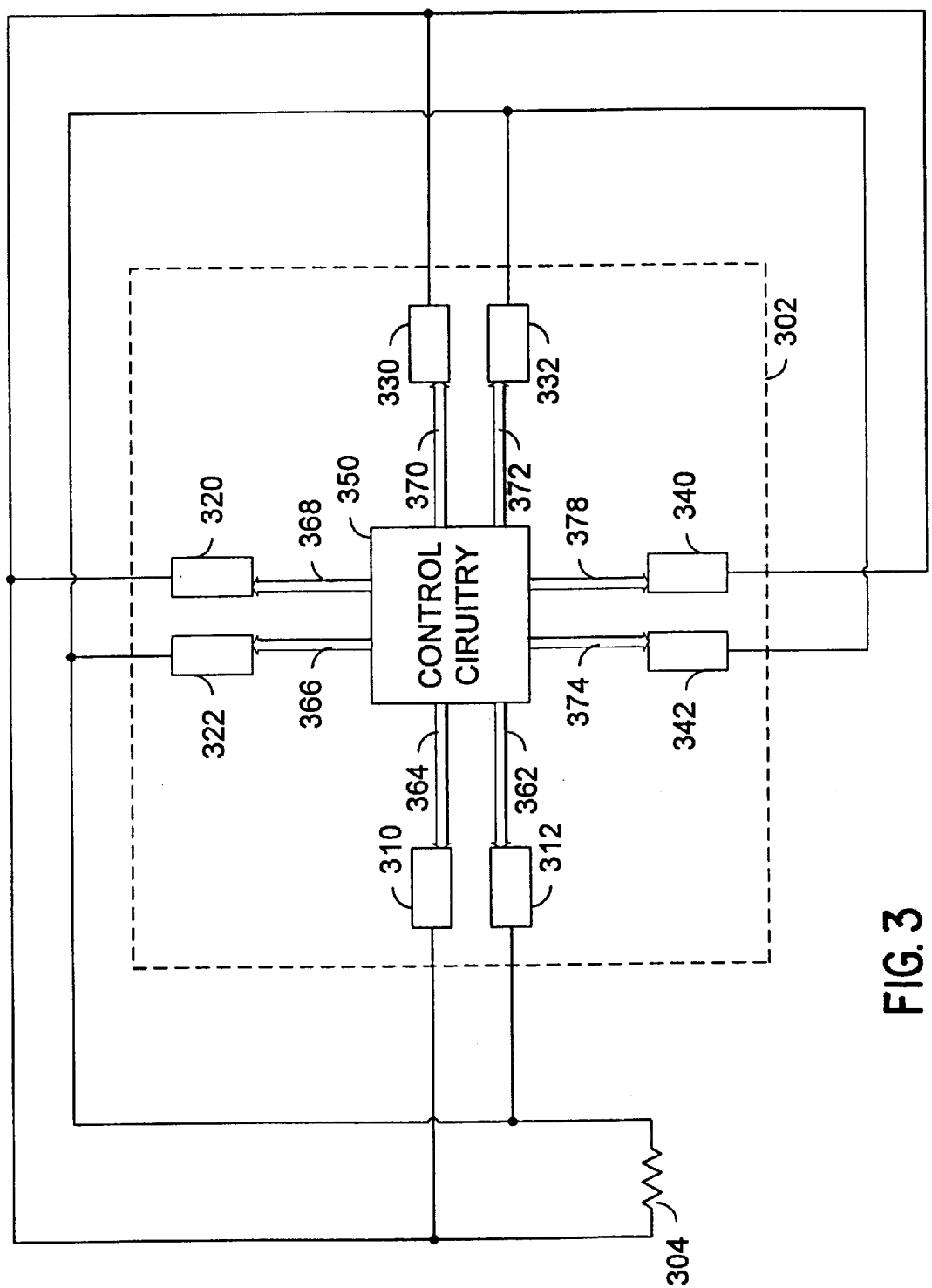
FIG. 3 is a schematic illustration showing the sharing of a single calibration resistor among several calibration circuits.

FIG. 3 is a schematic illustration showing the sharing of a single calibration resistor among several calibration circuits. In FIG. 3, resistor 304 is a single external calibration resistor shared among calibration circuits 310, 312, 320, 322, 330, 332, 340, 342. In a preferred embodiment, the elements inside of box 302 are circuitry that is on a single integrated circuit. The connections from calibration circuits 310, 312, 320, 322, 330, 332, 340, 342 to resistor 304 may be either on-chip connections, or off-chip wiring. In the preferred embodiment, however, these are on-chip connections.

Calibration circuits 310, 320, 330, and 340 are pull-up calibration circuits such as calibration circuit 200 shown in FIG. 2. A first terminal of resistor 304 is connected to the PAD 238 node of each calibration circuit 310, 320, 330, and 340. The control signals COUNT, CALPD, SELB, and HOLD of calibration circuit 200 are sent and controlled separately by control circuitry 350 to each instance 310, 320, 330, and 340 as indicated by arrows 364, 368, 370, and 378, respectively.

Calibration circuits 312, 322, 332, and 342 are pull-down calibration circuits such as calibration circuit 100 shown in FIG. 1. A second terminal of resistor 304 is connected to the PAD 138 node of each calibration circuit 312, 322, 332, and 342. The control signals COUNT, CALPU, SELB, and HOLD of calibration circuit 100 are sent and controlled separately by control circuitry 350 to each instance 312, 322, 332, and 342 as indicated by arrows 362, 366, 372, and 374, respectively.

Figure 4:
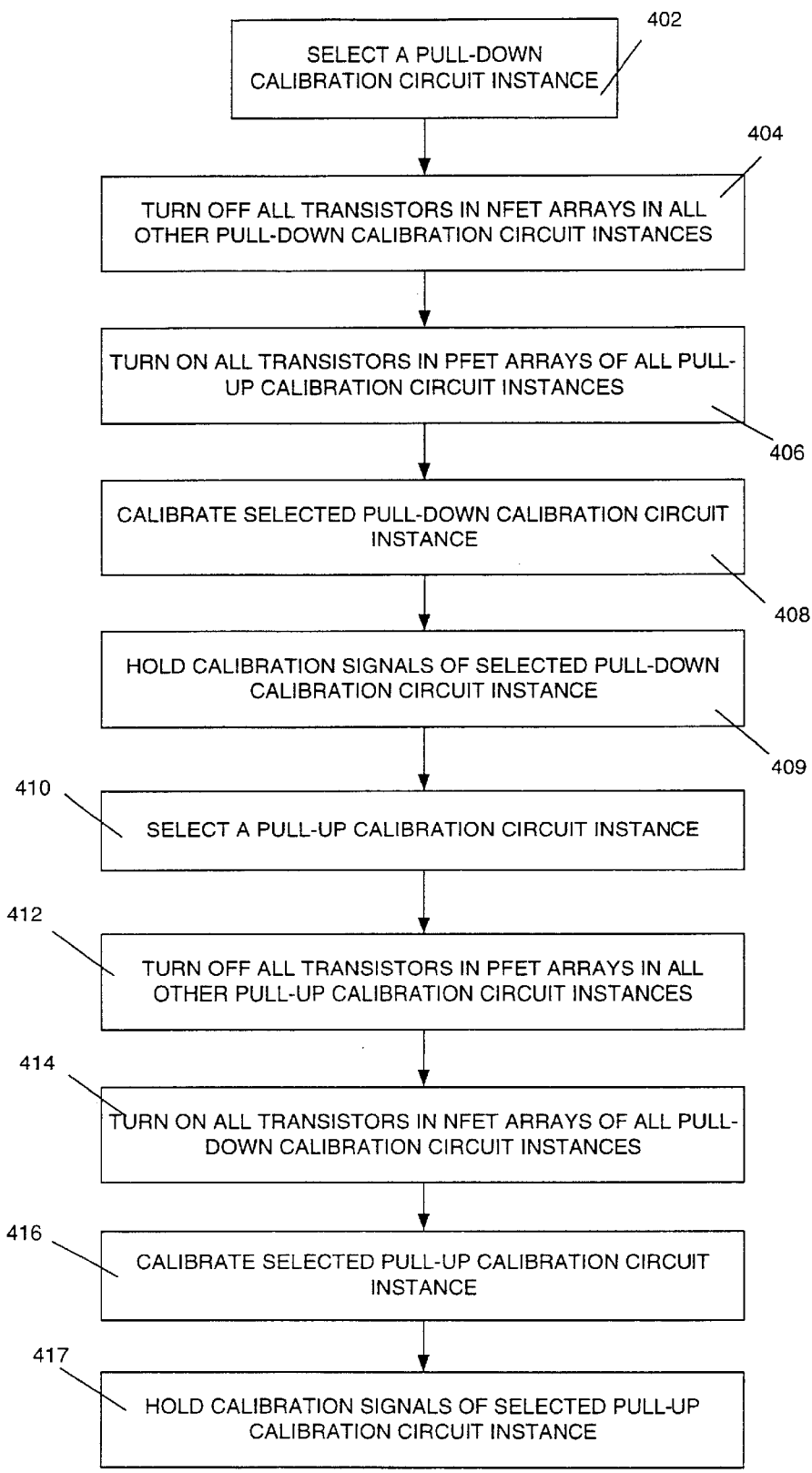
FIG. 4 is a flowchart illustrating the steps of sharing a single calibration resistor among several calibration circuits.

FIG. 4 is a flowchart illustrating the steps of sharing a single calibration resistor among several calibration circuits. In a step 402, an instance of the pull-down calibration circuitry is selected for calibration. A selection pattern that eventually selected all of the calibration circuits is preferred. For example, the first selected pull-down instance could be calibration circuit 312, the next 322, then 332, then 342. Finally, 312 would be selected again. In a step 404, all the transistors in the NFET arrays of the non-selected pull-down calibration circuits are turned off. This can be done by asserting the SELB signal on all of the non-selected pull-down calibration circuits. For example, if pull-down calibration circuit 312 is selected, then the SELB signal would be deasserted going into calibration circuit 312 by control circuitry 350. SELB would be asserted going into calibration circuits 322, 332, and 342 by control circuitry 350. Finally, since a pull-down calibration is taking place, the CALPU signal would be deasserted going into all the pull-down calibration circuits 312, 322, 332, and 342.

In a step 408, all the transistors in the PFET arrays of at least one of the pull-up calibration circuits are turned on. This provides a low impedance path from a positive supply node to one terminal of the external calibration resistor. In the preferred embodiment, the PFET arrays of all the pull-up calibration circuits s 310, 320, 330, and 340 are turned on. This is accomplished by control circuitry 350 by asserting the CALPD signal going into all of the pull-up calibration circuits 310, 320, 330, and 340. In another embodiment, a separate large transistor could be used to provide, or help lower the impedance of, the low impedance path from a positive supply node to one terminal of the external calibration resistor.

In a step 408, the selected pull-down calibration circuit is allowed to calibrate. Control circuitry 350 accomplishes this by asserting the COUNT signal and deasserting the HOLD signal going into the selected pull-down calibration circuit. The COUNT signal and the HOLD signal for the non-selected pull-down and pull-up calibration circuits remain deasserted, and asserted, respectively.

After enough time has elapsed for the selected calibration circuitry to stabilize, in a step 409, the HOLD signal is asserted and the COUNT signal deasserted going into the selected pull-down calibration circuit. This completes the process of calibrating one pull-down calibration circuit instance.

In a step 410, an instance of the pull-up calibration circuitry is selected for calibration. A selection pattern that eventually selected all of the calibration circuits is preferred. For example, the first selected pull-up instance could be calibration circuit 310, the next 320, then 330, then 340. Finally, 310 would be selected again. In a step 412, all the transistors in the PFET arrays of the non-selected pull-up calibration circuits are turned off. This can be done by asserting the SELB signal on all of the non-selected pull-up calibration circuits. For example, if pull-up calibration circuit 310 is selected, then the SELB signal would be deasserted going into calibration circuit 310 by control circuitry 350. SELB would be asserted going into calibration circuits 320, 330, and 340 by control circuitry 350. Finally, since a pull-up calibration is taking place, the CALPD signal would be deasserted going into all the pull-up calibration circuits 310, 320, 330, and 340.

In a step 414, all the transistors in the NFET arrays of at least one of the pull-down calibration circuits are turned on. This provides a low impedance path from one terminal of the external calibration resistor to a negative supply voltage. In the preferred embodiment, the NFET arrays of all the pull-down calibration circuits 312, 322, 332, and 342 are turned on. This is accomplished by control circuitry 350 by asserting the CALPU signal going into all of the pull-down calibration circuits 312, 322, 332, and 342. In another embodiment, a separate large transistor could be used to provide, or help lower the impedance of, the low impedance path from one terminal of the external calibration resistor to a negative supply voltage.

In a step 416, the selected pull-up calibration circuit is allowed to calibrate. Control circuitry 350 accomplishes this by asserting the COUNT signal and deasserting the HOLD signal going into the selected pull-up calibration circuit. The COUNT signal and the HOLD signal for the non-selected pull-down and pull-up calibration circuits remain deasserted, and asserted, respectively.

After enough time has elapsed for the selected calibration circuitry to stabilize, in a step 417, the HOLD signal is asserted and the COUNT signal deasserted going into the selected pull-up calibration circuit. This completes the process of calibrating one pull-up calibration circuit instance. The entire process may then be repeated for another pull-down and another pull-up calibration circuit instance.

Although a specific embodiment of the invention has been described and illustrated, the invention is not to be limited to the specific forms or arrangements of parts so described and illustrated. The invention is limited only by the claims.

What is claimed is:

1. A calibration apparatus, comprising:

a single calibration resistor having a first terminal and a second terminal;

a first calibration circuit of a first transistor type coupled to said first terminal for calibrating a drive impedance of an output driver; and, a second calibration circuit of a second transistor type coupled to said second terminal for calibrating the drive impedance of the output driver, wherein said calibration resistor compensates both said first calibration circuit and said second calibration circuit for use in calibrating the drive impedance, said first calibration circuit and said second calibration circuit do not calibrate the drive impedance at the same time, said first calibration circuit provides a connection from said first terminal to a first supply voltage when said second calibration circuit is calibrating the drive impedance, and said second calibration circuit provides a connection from said second terminal to a second supply voltage when said first calibration circuit is calibrating the drive impedance.

2. The apparatus of claim 1 wherein said first transistor type is a calibration circuit for n-channel field effect transistors and said second transistor type is a calibration circuit for p-channel field effect transistors.

3. The apparatus of claim 1 further comprising:

a third calibration circuit of said first transistor type coupled to said first terminal for calibrating the drive impedance of the output driver, wherein said first calibration circuit, said second calibration circuit, and said third calibration circuit do not calibrate said drive impedance at the same time.

4. A method of generating a plurality of calibration signal sets, comprising:

activating a first low impedance path from a first terminal of a single resistor to a first supply voltage;

generating a first calibration signal set with a first calibration circuit for calibrating a drive impedance of an output driver, said first calibration circuit being coupled to a second terminal of said resistor;

activating a second low impedance path from said second terminal of said resistor to a second supply voltage;

generating a second calibration signal set with a second calibration circuit for calibrating the drive impedance of the output driver, said second calibration circuit being coupled to said first terminal of said resistor;

using said resistor to compensate both said first calibration signal set and said second calibration signal set for use in calibrating the drive impedance, wherein said first calibration signal set and said second calibration signal set do not calibrate the drive impedance at the same time;

providing a connection with said first calibration circuit from said first terminal to a first supply voltage when said second calibration signal set is calibrating the drive impedance; and, providing a connection with said second calibration circuit from said second terminal to a second supply voltage when said first calibration signal set is calibrating the drive impedance.

5. The method of claim 4 wherein said first low impedance path is generated by said second calibration circuit and said second low impedance path is generated by said first calibration circuit.

6. The method of claim 5 further comprising:

deactivating the first low impedance path from said first terminal of said resistor to said first supply voltage; and, deactivating the second low impedance path from said second terminal of said resistor to said second supply voltage.

7. The method of claim 6 wherein said first low impedance path is activated when said first calibration signal set is being generated and said second low impedance path is activated when said second calibration signal set is being generated.

8. The method of claim 7 wherein said first low impedance path is deactivated when said second calibration signal set is being generated and said second low impedance path is deactivated when said first calibration signal set is being generated.

9. The method of claim 8 wherein said step of generating a first calibration signal set with a first calibration circuit and said step of generating a second calibration signal set with a second calibration circuit are not performed at the same time.

10. The method of claim 9 further comprising:

generating a third calibration signal set with a third calibration circuit for calibrating the drive impedance of the output driver, said third calibration circuit being coupled to said second terminal of said resistor.

11. The method of claim 10 wherein none of said step of generating a first calibration signal set with a first calibration circuit and said step of generating a second calibration signal set with a second calibration circuit are not performed at the same time and said step of generating a third calibration signal set with a third calibration circuit are performed at the same time.

12. The method of claim 9 further comprising:

generating a third calibration signal set with a third calibration circuit for calibrating the drive impedance of the output driver, said third calibration circuit being coupled to said first terminal of said resistor.

13. The method of claim 12 wherein none of said step of generating a first calibration signal set with a first calibration circuit and said step of generating a second calibration signal set with a second calibration circuit are not performed at the same time and said step of generating a third calibration signal set with a third calibration circuit are performed at the same time.

14. A calibration apparatus, comprising:

a control circuit providing control signals for use in calibrating a drive impedance of an output driver;

a plurality of calibration circuits, coupled to the control circuit, for calibrating the drive impedance of the output driver based upon the control signals; and a single resistor, coupled via first and second terminals to the plurality of calibration circuits, for use in compensating all of the plurality of the calibration circuits for the calibrating, wherein the plurality of calibration circuits include a first calibration circuit and a second calibration circuit which do not calibrate the drive impedance at the same time, the first calibration circuit provides a connection from the first terminal to a first supply voltage when the second calibration circuit is calibrating the drive impedance, and the second calibration circuit provides a connection from the second terminal to a second supply voltage when the first calibration circuit is calibrating the drive impedance.

15. The apparatus of claim 14 wherein the control circuit and the plurality of calibration circuits are contained on a single integrated circuit chip and the resistor is located off-chip from the integrated circuit chip.

16. The apparatus of claim 14 wherein the resistor is selectively and independently used by each of the calibration circuits for the calibrating.

17. A calibration apparatus, comprising:
- a calibration resistor having a first terminal and a second terminal;
- a first calibration circuit of a first transistor type coupled to said first terminal for calibrating a drive impedance of an output driver;
- a second calibration circuit of a second transistor type coupled to said second terminal for calibrating the drive impedance of the output driver;
- a third calibration circuit of said first transistor type coupled to said first terminal for calibrating the drive impedance of the output driver; and
- a fourth calibrator circuit of said second transistor type coupled to said second terminal for calibrating the drive impedance of the output driver, wherein said first calibration circuit, said second calibration circuit, said third calibration circuit, and said fourth calibration circuit do not calibrate the drive impedance at the same time, and wherein said first calibration circuit provides a connection from said first terminal to a first supply voltage when said second calibration circuit is calibrating the drive impedance, and wherein said second calibration circuit provides a connection from said second terminal to a second supply voltage when said first calibration circuit is calibrating the drive impedance.

* * * * *